United States Patent
Matsubara

(10) Patent No.: US 7,692,306 B2
(45) Date of Patent: Apr. 6, 2010

(54) SEMICONDUCTOR DEVICE

(75) Inventor: Yoshihisa Matsubara, Ibaraki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/785,653

(22) Filed: Apr. 19, 2007

(65) Prior Publication Data
US 2007/0249162 A1    Oct. 25, 2007

(30) Foreign Application Priority Data
Apr. 21, 2006    (JP)    .............................. 2006-117461

(51) Int. Cl.
*H01L 29/40* (2006.01)
(52) U.S. Cl. ........................ 257/773; 257/774; 257/776; 257/E33.066
(58) Field of Classification Search .................. None
See application file for complete search history.

(56) References Cited

U.S. PATENT DOCUMENTS 7,202,566 B2 * 4/2007 Liaw .......................... 257/758

2006/0097401 A1 * 5/2006 Kumagai ..................... 257/774

FOREIGN PATENT DOCUMENTS

JP    2004-228111    8/2004

* cited by examiner

*Primary Examiner*—Sue Purvis
*Assistant Examiner*—Fei Fei Yeung Lopez
(74) *Attorney, Agent, or Firm*—Young & Thompson

(57) ABSTRACT

In the conventional technology, a region of larger data rate causes a varied level of the light exposure in the lithographic operation in the process for manufacturing the semiconductor device, causing a problem of allowing narrower process window. A semiconductor device includes interconnects (first interconnects) elongating along a first direction in a substrate surface of the substrate (transverse direction in the diagram), interconnects (second interconnects), elongating along the interconnects, and being spaced apart from the interconnects in plan view, and slit vias (slit-shaped via plugs), elongating along a second direction (longitudinal direction in the diagram) of directions in the substrate surface of the above-described substrate, which is a direction normal to the first direction, and being capable of electrically coupling the interconnect to the interconnect.

20 Claims, 17 Drawing Sheets

SEMICONDUCTOR DEVICE

This application is based on Japanese patent application No. 2006-117461, the content of which is incorporated hereinto by reference.

BACKGROUND

1. Technical Field

The present invention relates to a semiconductor device.

2. Related Art

A typical test pattern utilized for an evaluating a process for a semiconductor device will be described. A general view of a layout of a test chip for a general process evaluation is shown in FIG. 8. Maximum values of a horizontal width d1 and a vertical width d2 in a dimension of a test chip are generally defined by employing a maximum field size of a lithographic apparatus. An evaluation pattern is composed of an assembly of evaluation blocks, which are also called as sub chips 803. The dimensions of the sub chips 803 are constant in the interior of the testing block. The reason thereof is that this leads to a fixed arrangement of measuring probes and a constant moving distances thereof in a program for measurement, thereby allowing a sharing of a program and a common use of measurement probes.

Subsequently, an outline of a pattern for evaluating an interconnect-related process will be described in reference to FIG. 9. The pattern for evaluating the interconnect process includes via chains, a pattern for evaluating electro migration (EM), a pattern for measuring a leakage or the like, which are mounted therein. Concerning the via chain, a pattern scaling is generally changed according to the length of the interconnect to be evaluated and the number of vias. A defect density can also be evaluated by utilizing different pattern scales. An evaluation block required for such process evaluation is referred to as test element group (TEG) region 901, and the electrode that a probe for electrical measurement lets come into contact is called electrode pad 902, and an interconnect that couples the TEG region 901 to the electrode pad 902 is referred to as a drawing interconnect 903.

An enlarged view of a region for coupling the TEG region to the electrode pad is illustrated in FIG. 10. FIG. 10 is a plan view, which includes a via chain pattern TEG region 1001 and drawing interconnects 1002, which electrically couples the region 1001 is to the electrode pads. Portions of the drawing interconnects 1002 coupled to via chain pattern TEG region 1001 are formed to have a linewidth that is larger than a linewidth of the interconnect in the region 1001.

In the via chain pattern TEG region 1001, M1 interconnects 1003 and M2 interconnects 1004 are alternately disposed, and these interconnects are mutually coupled by vias 1005. Meanwhile, linewidths d3 of the M1 interconnect 1003 and the M2 interconnect 1004 are 70 nm, which is equivalent to a minimum linewidth in the semiconductor device.

In FIG. 10, turning back M1 interconnects 1006 are provided. Meanwhile, the turning back region has an interconnect data rate of 75% over a minimum normalization area (140 nm×140 nm), which is area of a region 1008 that is composed of four grids having of a square having a side, which is equivalent to a minimum interconnect interval of repeated data. This is because the turning back region stores data in three grids of the above-described four grids.

Subsequently, a general process for forming a multiple-layered interconnect will be described by illustrating an example of a dual-layered interconnect. FIGS. 11A to 11C, FIGS. 12A to 12D, FIGS. 13A to 13D and FIGS. 14A to 14C are cross-sectional views, illustrating the process. These cross-sectional views represent cross sections along dotted line L1 in FIG. 10. First of all, an interlayer insulating film 1102 composed of silicon oxide film or the like is formed on a substrate 1101 via a chemical vapor deposition (CVD) process or the like (FIG. 11A). Elements such as transistors (not shown) are formed in the substrate 1101. Then, a resist 1103 is formed on the interlayer insulating film 1102, and the formed resist 1103 is patterned via a photolithographic process. Further, a pattern of the resist is transferred to the interlayer insulating film 1102 via a dry etch technology to form trenches 1104 for interconnects in desired positions (FIG. 11B). Then, the remained resist 1103 is removed (FIG. 1C).

Then, a resist 1201 is formed on the interlayer insulating film 1102, and the formed resist 1201 is patterned via a photolithographic process (FIG. 12A). Further, a pattern of the resist is transferred to the interlayer insulating film 1102 via a dry etch technology to form trenches 1202 for interconnects in desired positions. Then, the remained resist 1201 is removed (FIG. 12B). Subsequently, a conductor film 1203 such as a copper (Cu) film, an aluminum (Al) film and the like is deposited on the entire surface of the interlayer insulating film 1102 (FIG. 12C). Then, the conductor film 1203 is polished via a chemical mechanical polishing (CMP) process until the interlayer insulating film 1102 is exposed. As a result, an interconnect 1204 having a damascene structure is formed in a desired location of the interlayer insulating film 1102 (FIG. 12D).

Then, a diffusion barrier film 1301 composed of a silicon carbide (SiC) film or the like is formed on the interlayer insulating film 1102 having the interconnect 1204 formed thereon, and then, an interlayer insulating film 1302 composed of a silicon oxide film or the like is formed thereon (FIG. 13A). Subsequently, a resist 1303 is formed on the interlayer insulating film 1302, and the formed resist 1303 is patterned via a photolithographic process (FIG. 13B). Further, a pattern of the resist is transferred to the interlayer insulating film 1302 via a dry etch technology to form trenches 1304 for interconnects in desired positions. Then, the remained resist 1303 is removed. Subsequently, a conductor film 1305 such as a Cu film, an Al film and the like is deposited on the entire surface of the interlayer insulating film 1302 (FIG. 13C). Then, the conductor film 1305 is polished via a CMP process until the interlayer insulating film 1302 is exposed. As a result, vias 1306 are formed in desired locations of the interlayer insulating film 1302 (FIG. 13D).

Then, a diffusion barrier film 1401 composed of a SiC film or the like is formed on the interlayer insulating film 1302 having the vias 1306 formed thereon, and then, an interlayer insulating film 1402 composed of a silicon oxide film or the like is formed thereon (FIG. 14A). Subsequently, a resist is formed on the interlayer insulating film 1402, and the formed resist is patterned via a photolithographic process. Further, a pattern of the resist is transferred to the interlayer insulating film 1402 via a dry etch technology to form trenches 1403 for interconnects in desired positions. Then, the remained resist is removed (FIG. 14B). Subsequently, a conductor film such as a Cu film, an Al film and the like is deposited on the entire surface of the interlayer insulating film 1402. Then, the conductor film is polished via a CMP process until the interlayer insulating film 1402 is exposed. As a result, an interconnect 1404 having a damascene structure is formed in a desired location of the interlayer insulating film 1402 (FIG. 14C).

A structure of a coupling interconnect from a certain isolated block to an electric block in electrically dense blocks is not limited to a TEG drawing interconnect for evaluating the process, and a similar structure is employed for the product. Therefore, a typical conventional product thereof will be described as follows.

FIG. 15 is a plan view, showing an outline of a general logic product. A conventional configuration in a general CPU logic circuit will be described in reference to FIG. 15. This product has four macro-functions, namely an input-output (I/O) block 1501, a random access memory (RAM) block 1502, a logic block 1503 and a phase locked loop (PLL) block 1504.

The I/O block 1501 is an area composed of only interconnects having the linewidth of not smaller than 1 μm. In such area, there is basically no need for a narrower interconnect. Further, this area serves as determining a limitation on an allowable high-current, and maximum values of the linewidth and the via dimension are determined by such area. An interconnect that couples the circuit blocks in the I/O block is composed of two interconnects, namely an interconnect that is coupled to a pad electrode (input interconnect) and an interconnect that is coupled to an internal circuit (output interconnect).

The RAM block 1502 generally includes a memory device of around 1 MB. A priority is given to a miniaturization for the interconnects in such area over an operating speed. Therefore, this area is an area of highest need for narrower interconnects. Relatively few large interconnects are included in this area, and power supply interconnects and ground interconnects are alternately disposed with a pitch of a memory cell size.

The logic block 1503 is a cell, in which higher drive capacity is required, and is also a block, in which power supply interconnects are enhanced. A configuration of this area is basically similar to a configuration of a standard cell of a gate array. The configuration of this area related to the interconnects generally includes enhanced power supply interconnects as compared with that of the RAM, though it is similar to that of RAM. A plurality of couplings between macro circuits are generally included, unlikely in the case of the PLL.

Since stable operations of the power supply, the ground and the capacitor element are prioritized in the PLL block 1504, the PLL block 1504 generally requires second largest linewidth, second only to the I/O region, though the interconnect density therein is lower. The PLL serves as amplifying a signal input from an external transmitter (amplifying a signal to, for example, in 4 times or 5 times of the original), so as to compose clock trees in respective macros. A clock input section and a clock output section in this clock serves as drawing interconnects from the macro circuit. Only two input and output interconnects are basically present in the PLL.

A block coupling structure of two macro circuits in a logic unit will be described in reference to FIG. 16. In FIG. 16, a region between two macro circuits of a first logic region 1601 and a second logic region 1602 is a region 1603. Power supply meshes 1604 and ground meshes 1605 are disposed in the macro. Connections and signal interconnects 1606 serving as a circuit structure factor are disposed between the power supply meshes 1604 and the ground meshes 1605 in the macro. Further, signal interconnects for connecting these macros are drawn. A region for preparing a coupling of the signal interconnects is a region 1607. The macros may be mutually coupled in the same interconnect layer or may be mutually coupled in different interconnect layers.

An enlarged view of the macro is shown in FIG. 17. FIG. 17 shows a logic unit 1701 and a macro coupling region 1702. A portion of the interconnect 1703 has a linewidth that is wider than a linewidth of the interconnect in the macro in the macro coupling region 1702. The interconnect 1703 is coupled to a M2 interconnect 1708 through via 1707 within the macro.

The power supply interconnects 1704 and the ground interconnects 1705 are alternately disposed. It is common that the signal interconnects 1706 are disposed between the power supply interconnects 1704 and ground interconnects 1705. Further, it is common that the signal interconnect 1706 is arranged to be in parallel with x direction (transverse direction in the diagram) and with y direction (longitudinal direction in the diagram).

In addition to above, typical prior art documents related to the present invention includes Japanese Patent Laid-Open No. 2004-228111.

However, in the conventional technology, a region of larger data rate causes a varied level of the light exposure in the lithographic operation in the process for manufacturing the semiconductor device, causing a problem of allowing narrower process window. The narrower process window may cause, for example, a break in the end of the macro coupling region, leading to a short circuit.

Optimum level of light exposure in the lithographic process is decreased as the data rate is increased. This is resulted from a flare phenomenon, namely a phenomenon that a blurring is caused in a pattern image by an irregular reflection of a beam through a lens. This phenomenon is characterized that the pattern geometry is changed depending on the data rate. Therefore, in order to inhibiting such phenomenon, it is required to provide a limitation in a range of the available interconnect data rate.

SUMMARY OF THE INVENTION

According to the present invention, there is provided a semiconductor device having an interconnect layer provided on a substrate, comprising: a first interconnect, provided in the interconnect layer, and elongating along a first direction included in a substrate surface of the substrate; a second interconnect, provided in the interconnect layer, elongating along the first interconnect, and being spaced apart from the first interconnect in plan view; and a slit-shaped via plug, provided in the interconnect layer, elongating along a second direction, which is a direction being normal to the first direction and is included in the substrate surface of the substrate, and being capable of electrically coupling the first interconnect to the second interconnect.

In such semiconductor device, an electrical coupling between the first interconnect and the second interconnect is provided by employing a slit-shaped via plug that elongates along a direction normal to these elongation directions. This configuration provides a reduced interconnect data rate generated in a turning back region of the interconnect.

According to the present invention, a semiconductor device, which is capable of providing a reduced interconnect data rate generated in a turning back region of the interconnect, can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of semiconductor devices according to the present invention will be described in reference to the annexed figures. In all figures, identical numeral is assigned to an element commonly appeared in both of the description of the present invention the description of the related art, and the detailed description thereof will not be repeated.

Figure 1:
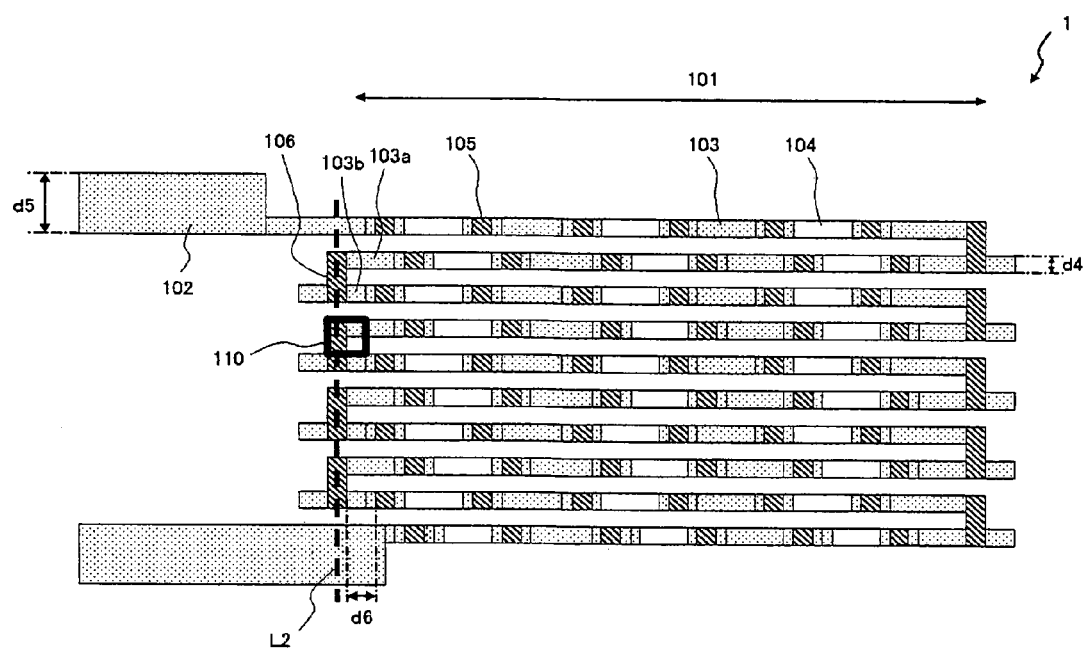
FIG. 1 is a plan view, showing an example of a semiconductor device according to the present invention.

FIG. 1 is a plan view, showing an exemplary implementation of a semiconductor device according to the present invention. A semiconductor device 1 includes interconnects 103a (first interconnects) elongating along a first direction in a substrate surface of the substrate (transverse direction in the diagram), interconnects 103b (second interconnects), elongating along the interconnects 103a, and being spaced apart from the interconnects 103a in plan view, and slit vias 106 (slit-shaped via plugs), elongating along a second direction (longitudinal direction in the diagram) of directions in the substrate surface of the above-described substrate, which is a direction normal to the first direction, and being capable of electrically coupling the interconnect 103a to the interconnect 103b. The interconnects 103a, the interconnect 103b and the slit vias 106 are formed in an interconnect layer provided on the substrate. The above-described second direction is, for example, a direction being normal to an elongating direction of a power supply mesh or a ground mesh of the semiconductor device 1. In addition to above, the substrate and the interconnect layer are not shown in the diagram. Further, the substrate may be a semiconductor substrate, or may be a substrate other than a semiconductor substrate.

Both of the interconnect 103a and the interconnect 103b are portions of the M1 interconnect 103. Therefore, the interconnects 103a and the interconnects 103b are provided in the same layer in the interconnect layer. Further, linewidths d4 of the interconnect 103a and the interconnect 103b are equivalent to a minimum linewidth in the semiconductor device 1 (e.g., 70 mm). It is preferable that the minimum linewidth is equal to or smaller than 0.1 μm. M2 interconnects 104 are coupled to M1 interconnect 103 through vias 105. In the present embodiment, a linewidth of the M2 interconnect 104 is also equivalent to the above-described minimum linewidth.

The semiconductor device 1 is provided with a TEG region 101 for evaluating the via chain and drawing interconnects 102 for electrically coupling to the TEG region 101 to electrode pads. In the TEG region 101, the M1 interconnects 103 and the M2 interconnects 104 are alternately disposed, and these interconnects are mutually coupled through the vias 105. A linewidth d5 of an isolated interconnect section is, for example, 0.3 μm. A minimum interval in the TEG region 101 corresponding to the macro region is 140 nm, for example. A width and a length of the slit via 106 provided in a turning back region of the interconnect are, for example, 70 nm and 210 nm, respectively. The length direction (elongation direction) of the slit via 106 is provided to be a direction that is normal to the elongating direction of the M1 interconnect 103 and the M2 interconnect 104, as described above. This helps attempting a reduction in the data density.

A spacing d6 between the slit via 106 and the most proximal via 105 is preferably equal to or larger than 140 nm. This can easily achieve a good balance between the process for patterning the slit via 106 and the process for patterning the via 105 in the via layer.

Figure 10:
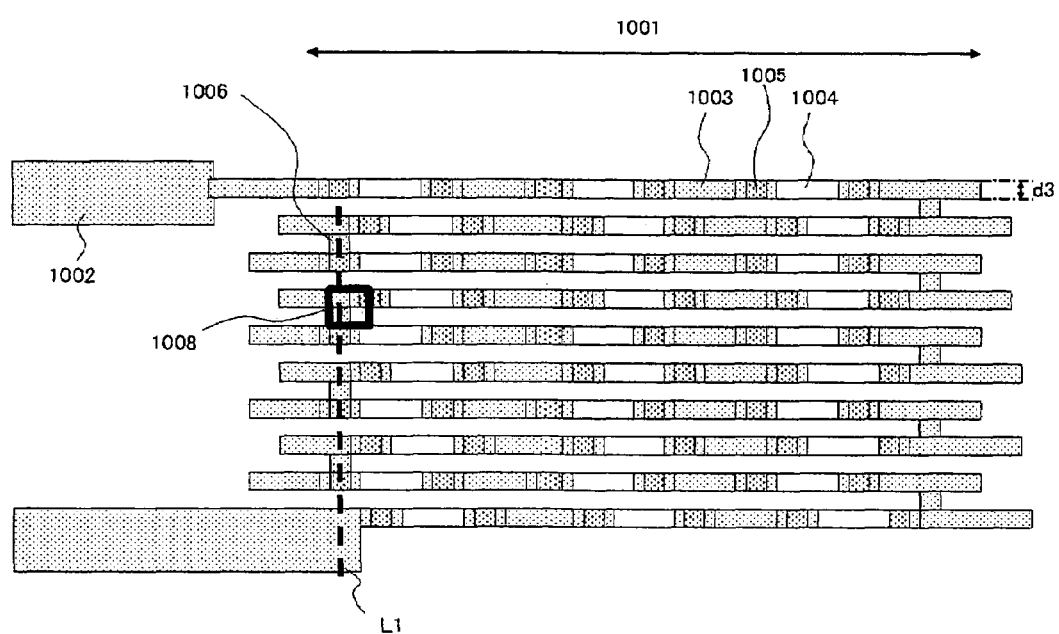
FIG. 10 is a plan view, showing a region for coupling the TEG region with the electrode pad.
Figure 11A:
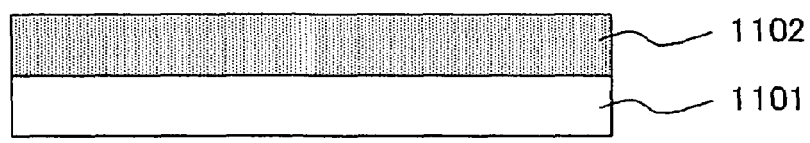
FIGS. 11A to 11C are cross-sectional views, which are helpful in describing a general process for forming a dual-layered interconnect.
Figure 11B:
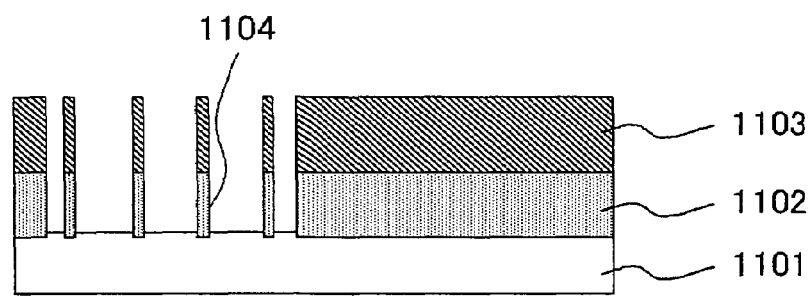
Figure 11C:
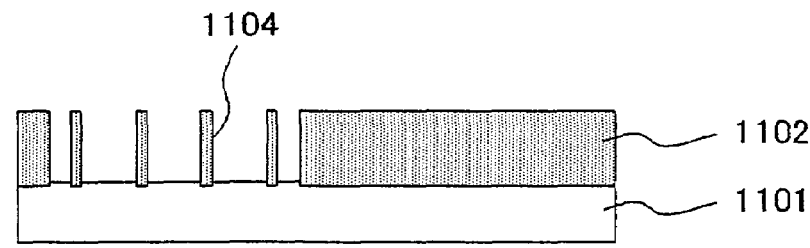
Figure 12A:
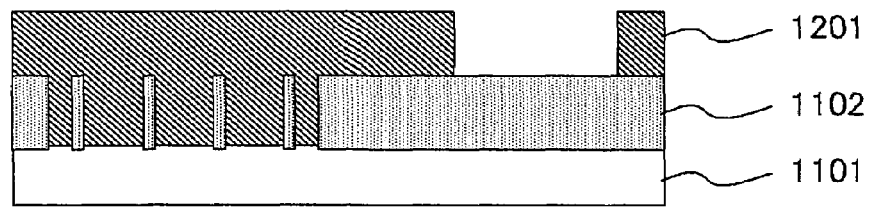
FIGS. 12A to 12D are cross-sectional views, which are helpful in describing the general process for forming the dual-layered interconnect.
Figure 12B:
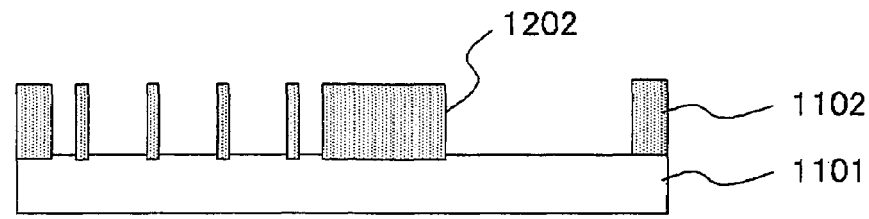
Figure 12C:
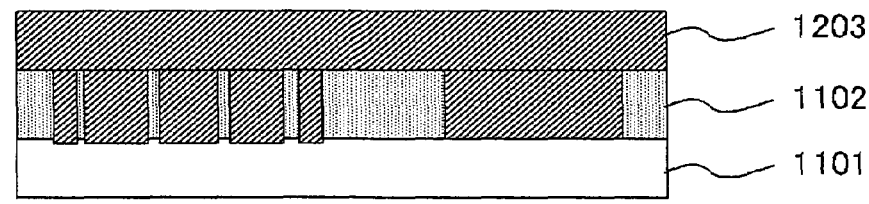
Figure 12D:
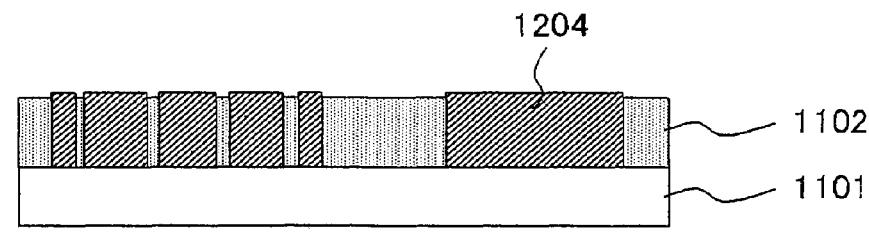
Figure 13A:
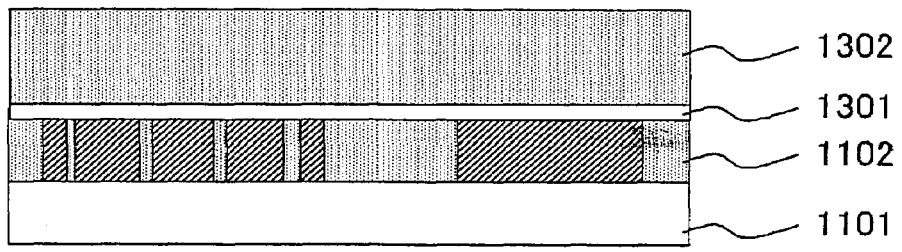
FIGS. 13A to 13D are cross-sectional views, which are helpful in describing the general process for forming the dual-layered interconnect.
Figure 13B:
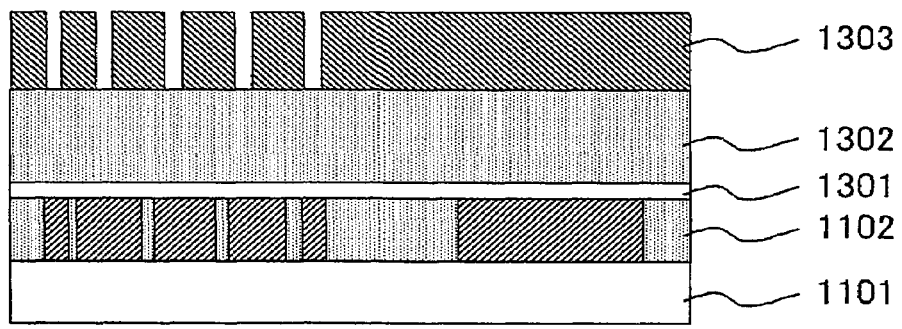
Figure 13C:
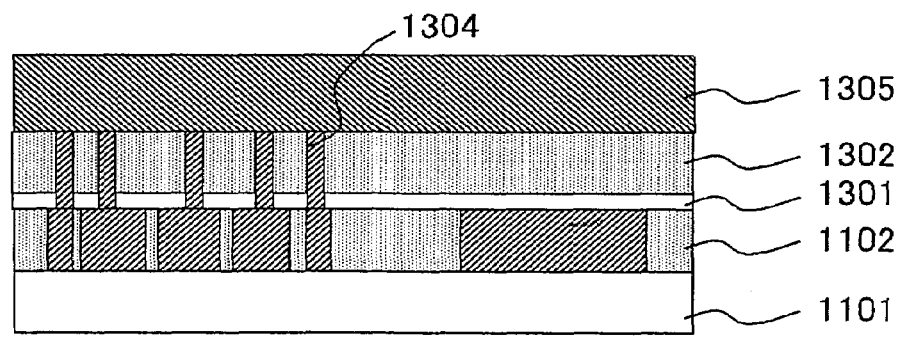
Figure 13D:
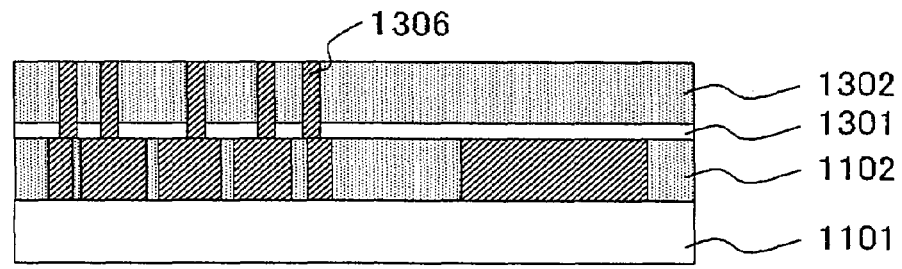
Figure 14A:
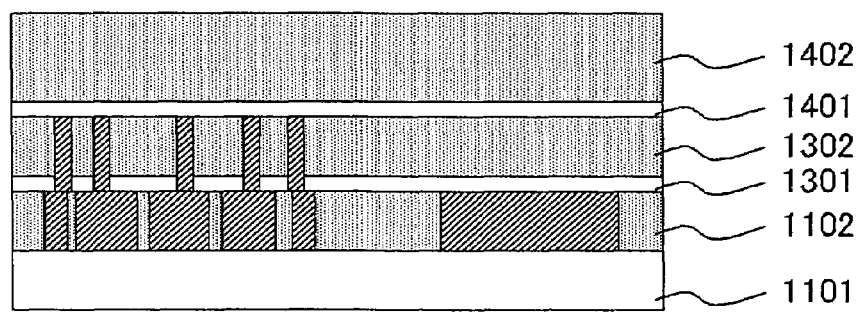
FIGS. 14A to 14C are cross-sectional views, which are helpful in describing the general process for forming the dual-layered interconnect.
Figure 14B:
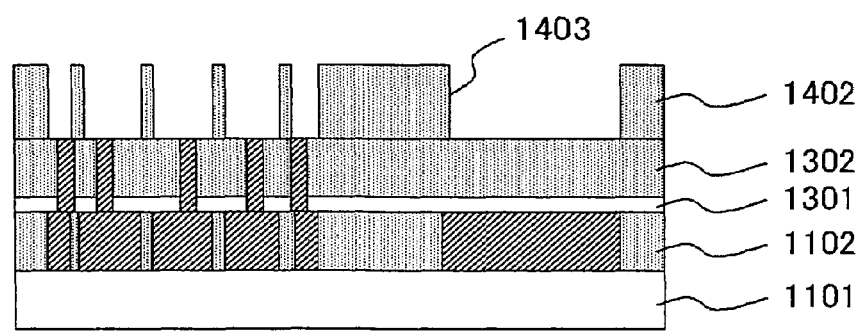
Figure 14C:
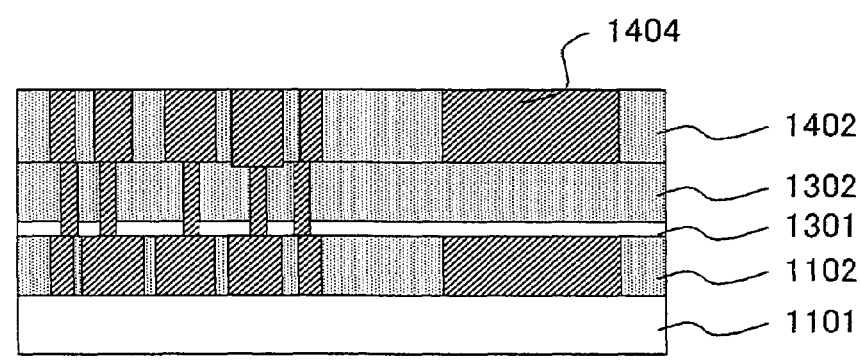

The data layer of X direction (transverse direction in the diagram) is assigned to the M1 layer. On the other hand, the data layer of y direction (longitudinal direction in a diagram of) perpendicular to x direction is assigned to the via layer. A direction providing higher operation frequency is present in the interconnect data. Such basic isolation of the data layer achieves a reduction in the data density. As a result, the turning back region has an interconnect data rate of 50% over a minimum normalization area (140 nm×140 nm, if the above-described minimum interconnect interval is 70 nm), which is area of a region 110 that is composed of four grids each having of a square having a side, which is equivalent to a minimum interconnect interval of repeated data. Therefore, the reduced interconnect data rate is achieved over the conventional technology described in reference to FIG. 10 (interconnect data rate is 75%).

As described above, the electrical coupling between the interconnect 103a and the interconnect 103b is presented by the slit via 106 extending along the direction normal to the elongation direction thereof, so that the interconnect data rate generated in the turning back region of the interconnect can be reduced. Further, since such technique involves dividing the interconnect data along the interconnect direction, it is advantageous that a data distribution process can be effectively achieved without a need for calculating individual interconnect data rate.

Figure 7:
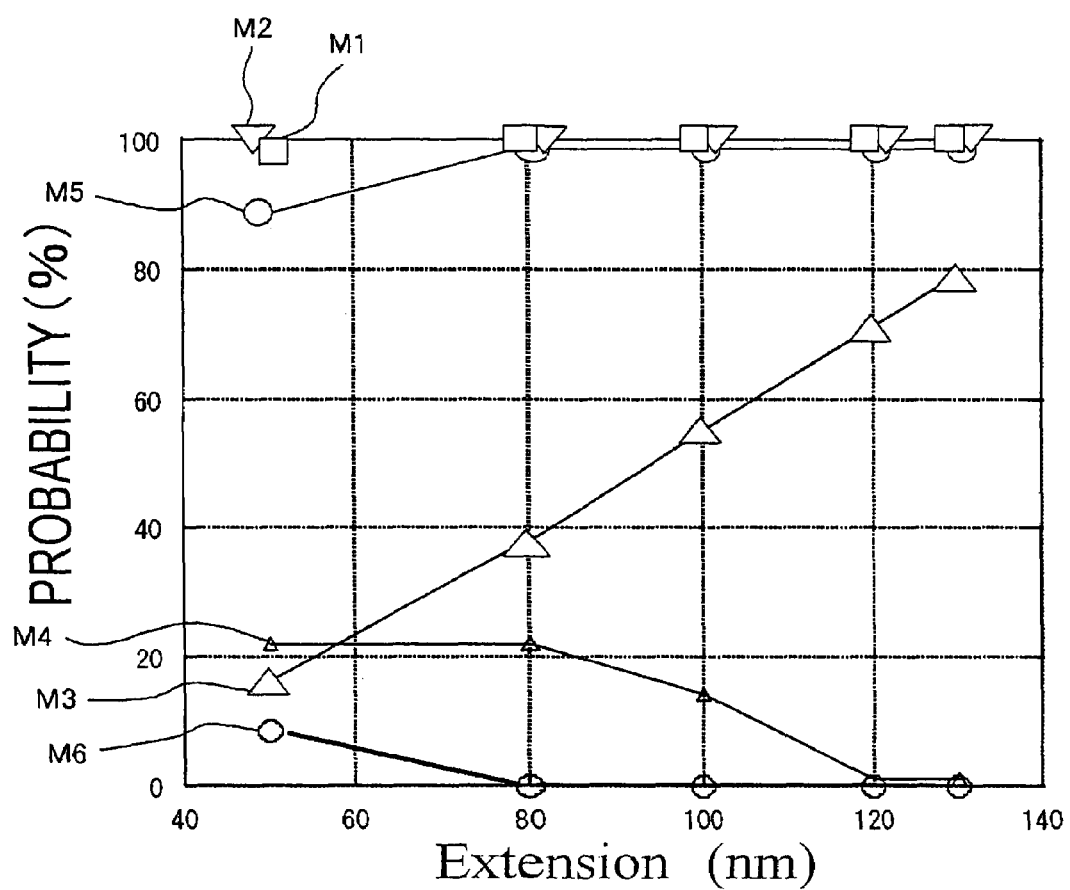
FIG. 7 is a graph, showing experimental results for confirming the advantageous effect of the present invention, in which ordinate represents frequencies of failure generation for 50,000 of series via chains, and abscissa represents lengths (extension length) of interconnect data added from the via end.
Figure 8:
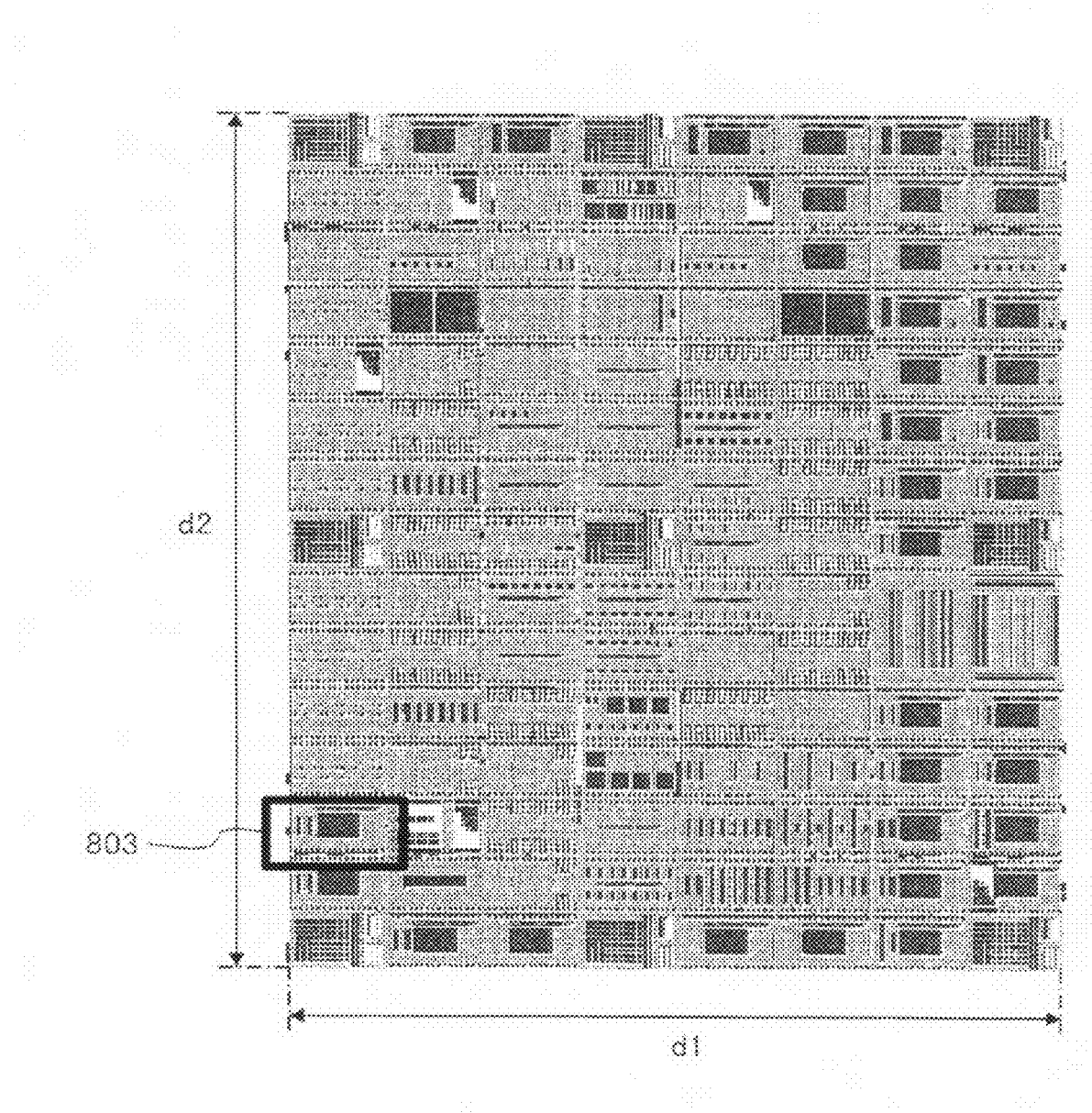
FIG. 8 is a plan view, showing a layout of a general test chip for evaluating process.
Figure 9:
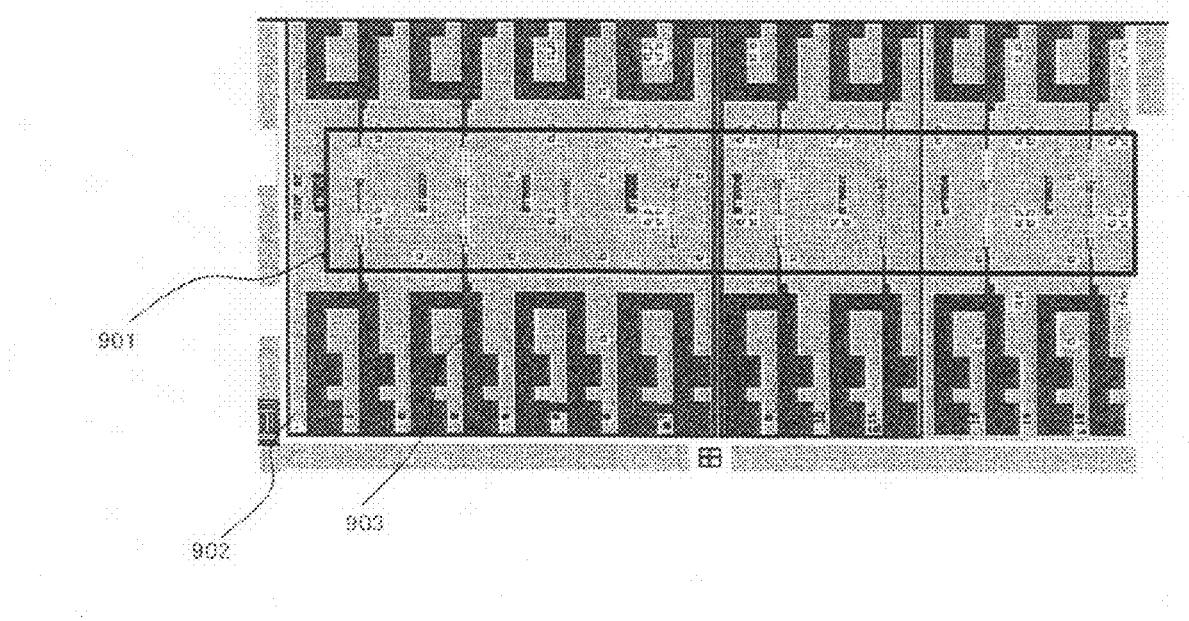
FIG. 9 is a plan view, which is helpful in describing an outline of a pattern for evaluating the interconnect process.

FIG. 7 is a graph, showing experimental results for confirming the advantageous effect of the present invention. In the graph, marks M1, M2, M3 and M4 represent data obtained by the conventional technology, and marks M5 and M6 represent data obtained by the present embodiment. The marks M1, M2, M3 and M4 related to the conventional technology are relevant to cases for the minimum linewidth of 0.2 μm, 0.16 μm, 0.1 μm and 0.1 μm, respectively. Besides, the marks M1, M2 and M3 are relevant to non-defective products in the coupling, and the mark M4 is relevant to a defective product in the coupling. Further, both of the mark M5 and M6 of the present embodiment are relevant to cases for the minimum linewidth of 0.1 μm. Besides, the mark M5 are relevant to a non-defective product in the coupling, and the mark M6 is relevant to a defective product in the coupling.

Since data rate in the turning back region of the interconnect can be reduced in the present embodiment, as shown in the graph, a problem of increased width of the interconnect can be eliminated, and thus the problem caused in the conventional technology, namely the problem of occurring failure due to a flare resulted from higher data rate, can be inhibited.

Figure 2A:
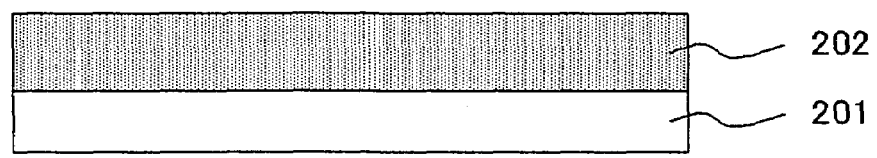
FIGS. 2A to 2C are cross-sectional views of the semiconductor device, which are helpful in describing a method for manufacturing the semiconductor device of FIG. 1.
Figure 2B:
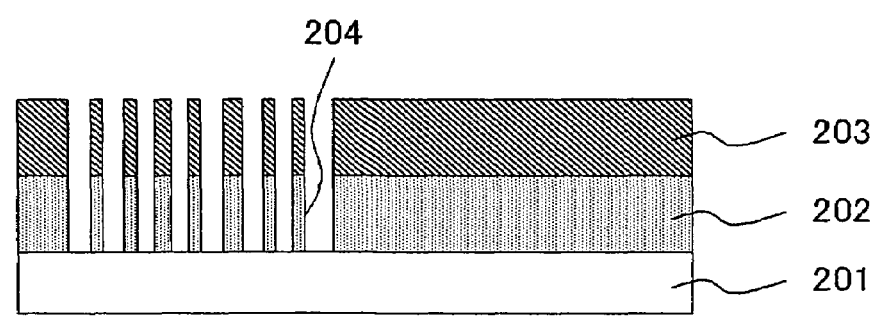
Figure 2C:
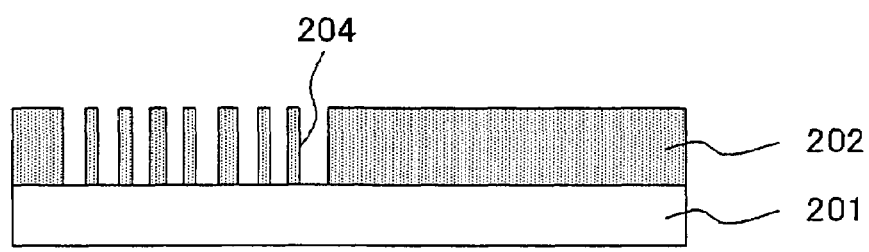

An example of a method for manufacturing the semiconductor device 1 will be described in reference to FIGS. 2A to 2C, FIGS. 3A to 3D, FIGS. 4A to 4D and FIGS. 5A to 5C. These diagrams show cross sections along dotted line L2 in FIG. 1. First of all, an interlayer insulating film 202 composed of a silicon oxide film or the like is formed on a silicon substrate 201 via a CVD process or the like (FIG. 2A). Then, a resist 203 is formed on the interlayer insulating film 202, and the formed resist 203 is patterned via a photolithographic process. Further, a pattern of the resist is transferred to the interlayer insulating film 202 via a dry etch technology to form trenches 204 for interconnects in desired positions (FIG. 2B). Then, the remained resist 203 is removed (FIG. 2C).

Figure 3A:
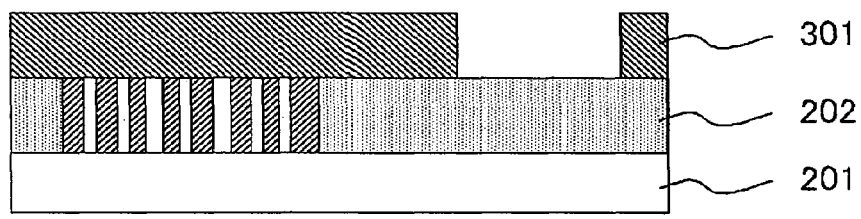
FIGS. 3A to 3D are cross-sectional views of the semiconductor device, which are helpful in describing a method for manufacturing the semiconductor device of FIG. 1.
Figure 3B:
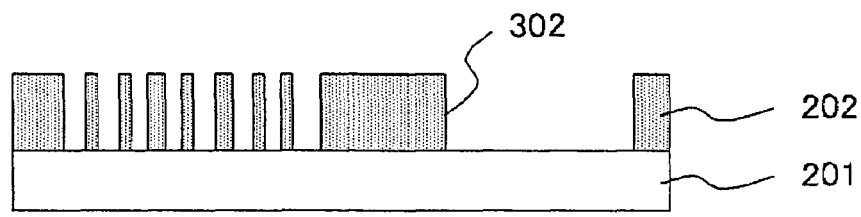
Figure 3C:
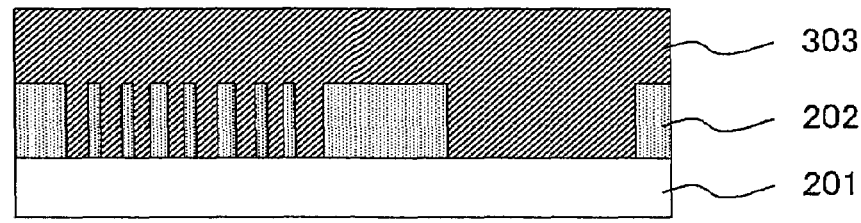
Figure 3D:
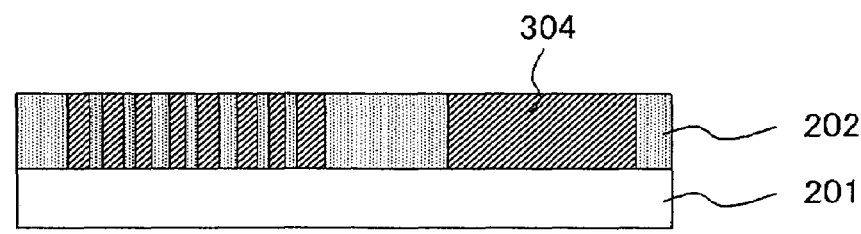

Then, a resist 301 is formed on the interlayer insulating film 202, and the formed resist 301 is patterned via a photolithographic process (FIG. 3A). Further, a pattern of the resist is transferred to the interlayer insulating film 202 via a dry etch technology to form trenches 302 for interconnects in desired positions. Then, the remained resist 301 is removed (FIG. 3B). Subsequently, a conductor film 303 such as a Cu film, an Al film and the like is deposited on the entire surface of the interlayer insulating film 202 (FIG. 3C). Then, the conductor film 303 is polished via a CMP process until the interlayer insulating film 202 is exposed. As a result, an interconnect 304 having a damascene structure is formed in a desired location of the interlayer insulating film 202 (FIG. 3D).

Figure 4A:
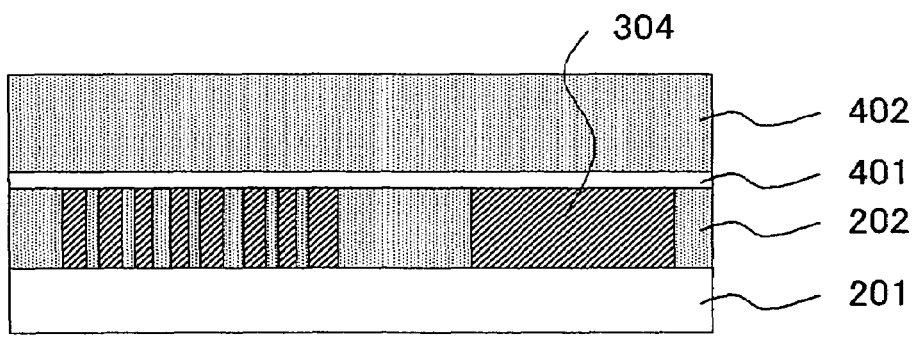
FIGS. 4A to 4D are cross-sectional views of the semiconductor device, which are helpful in describing a method for manufacturing the semiconductor device of FIG. 1.
Figure 4B:
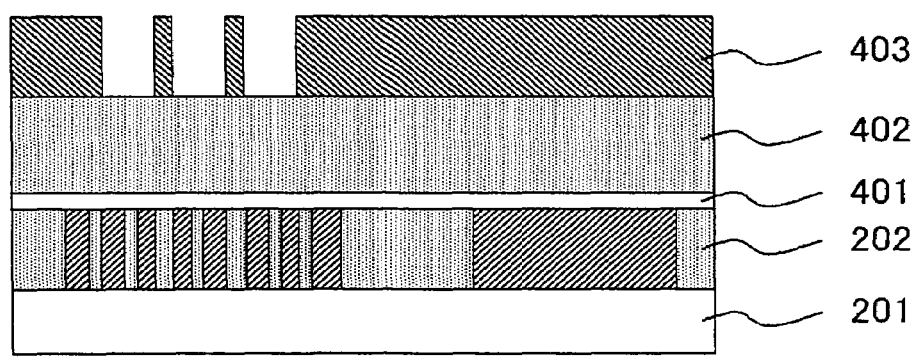
Figure 4C:
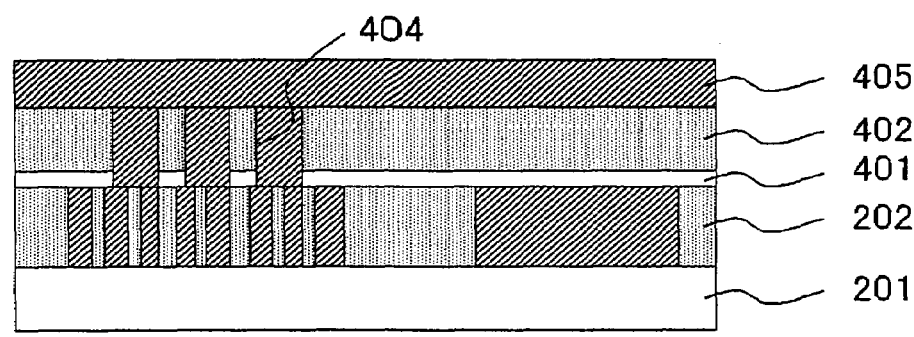
Figure 4D:
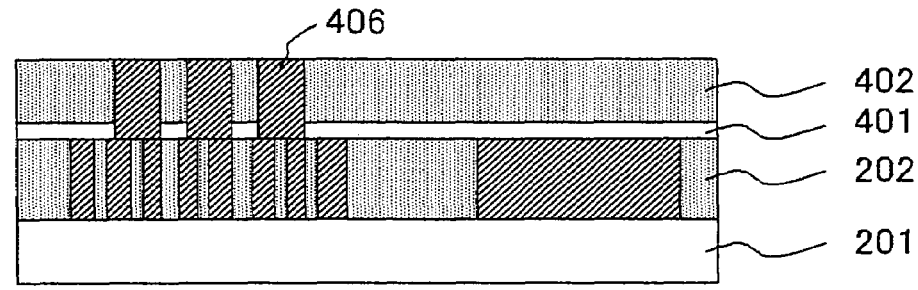

Then, a diffusion barrier film 401 composed of a SiC film or the like is formed on the interlayer insulating film 202 having the interconnect 304 formed thereon, and then, an interlayer insulating film 402 composed of a silicon oxide film is formed thereon (FIG. 4A). Subsequently, a resist 403 is formed on the interlayer insulating film 402, and the formed resist 403 is patterned via a photolithographic process (FIG. 4B). Further, a pattern of the resist is transferred to the interlayer insulating film 402 via a dry etch technology to form trenches 404 for interconnects in desired positions. Then, the remained resist 403 is removed. Subsequently, a conductor film 405 such as a Cu film, an Al film and the like is deposited on the entire surface of the interlayer insulating film 402 (FIG. 4C). Then, the conductor film 405 is polished via a CMP process until the interlayer insulating film 402 is exposed. As a result, vias 406 are formed in desired locations of the interlayer insulating film 402 (FIG. 4D).

Figure 5A:
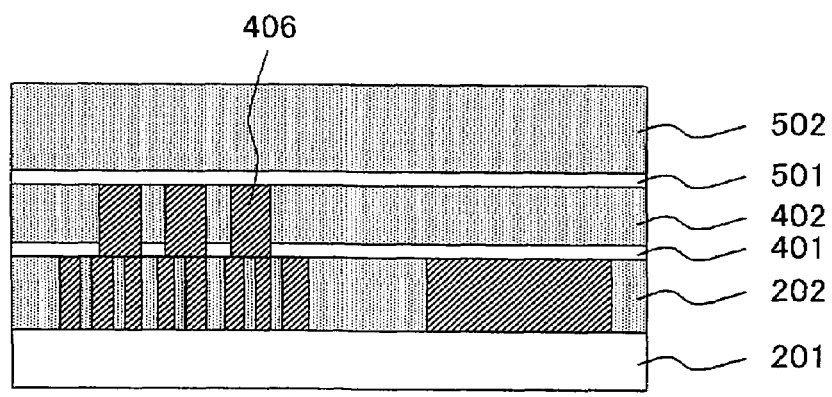
FIGS. 5A to 5C are cross-sectional views of the semiconductor device, which are helpful in describing a method for manufacturing the semiconductor device of FIG. 1.
Figure 5B:
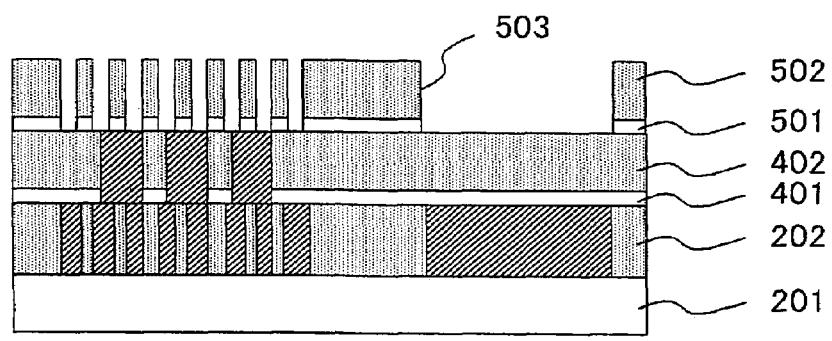
Figure 5C:
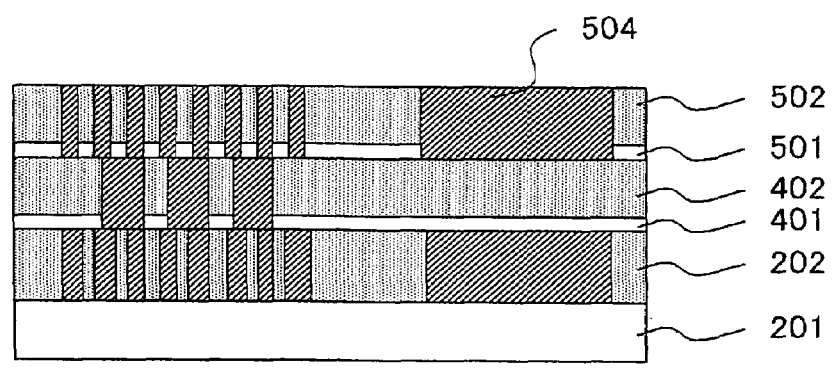

Then, a diffusion barrier film 501 composed of a SiC film or the like is formed on the interlayer insulating film 402 having the vias 406 formed thereon, and then, an interlayer insulating film 502 composed of a silicon oxide film or the like is formed thereon (FIG. 5A). Subsequently, a resist is formed on the interlayer insulating film 502, and the formed resist is patterned via a photolithographic process. Further, a pattern of the resist is transferred to the interlayer insulating film 502 via a dry etch technology to form trenches 503 for interconnects in desired positions. Then, the remained resist is removed (FIG. 5B). Subsequently, a conductor film such as a Cu film, an Al film and the like is deposited on the entire surface of the interlayer insulating film 502. Then, the conductor film is polished via a CMP process until the interlayer insulating film 502 is exposed. As a result, an interconnect 504 having a damascene structure is formed in a desired location of the interlayer insulating film 502 (FIG. 5C).

Figure 6:
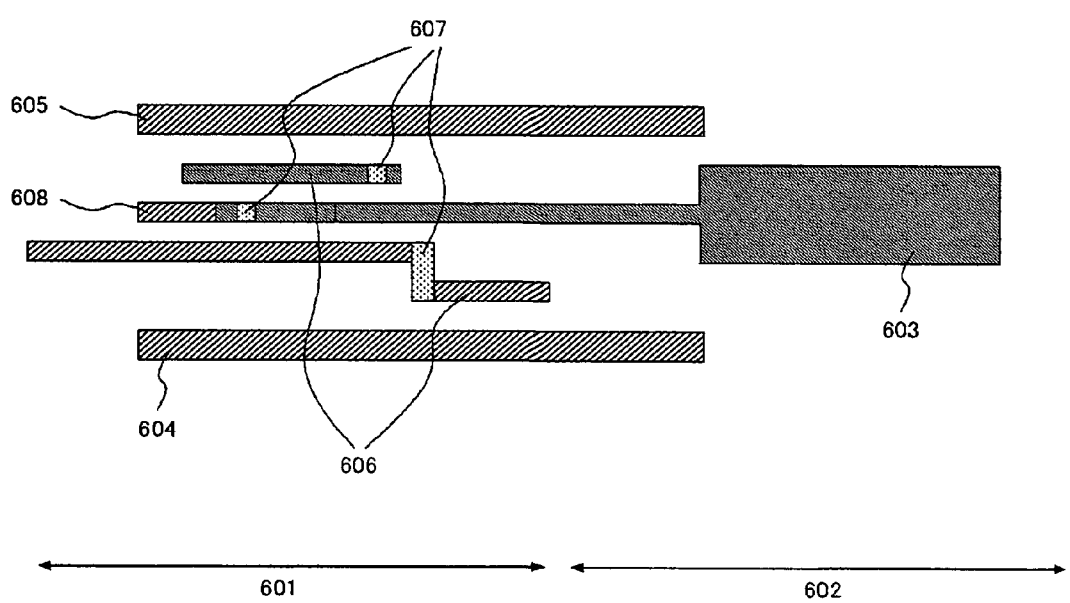
FIG. 6 is a plan view of a semiconductor device, helpful in describing an exemplary implementation, in which the present invention applied to a general logic circuit.
Figure 15:
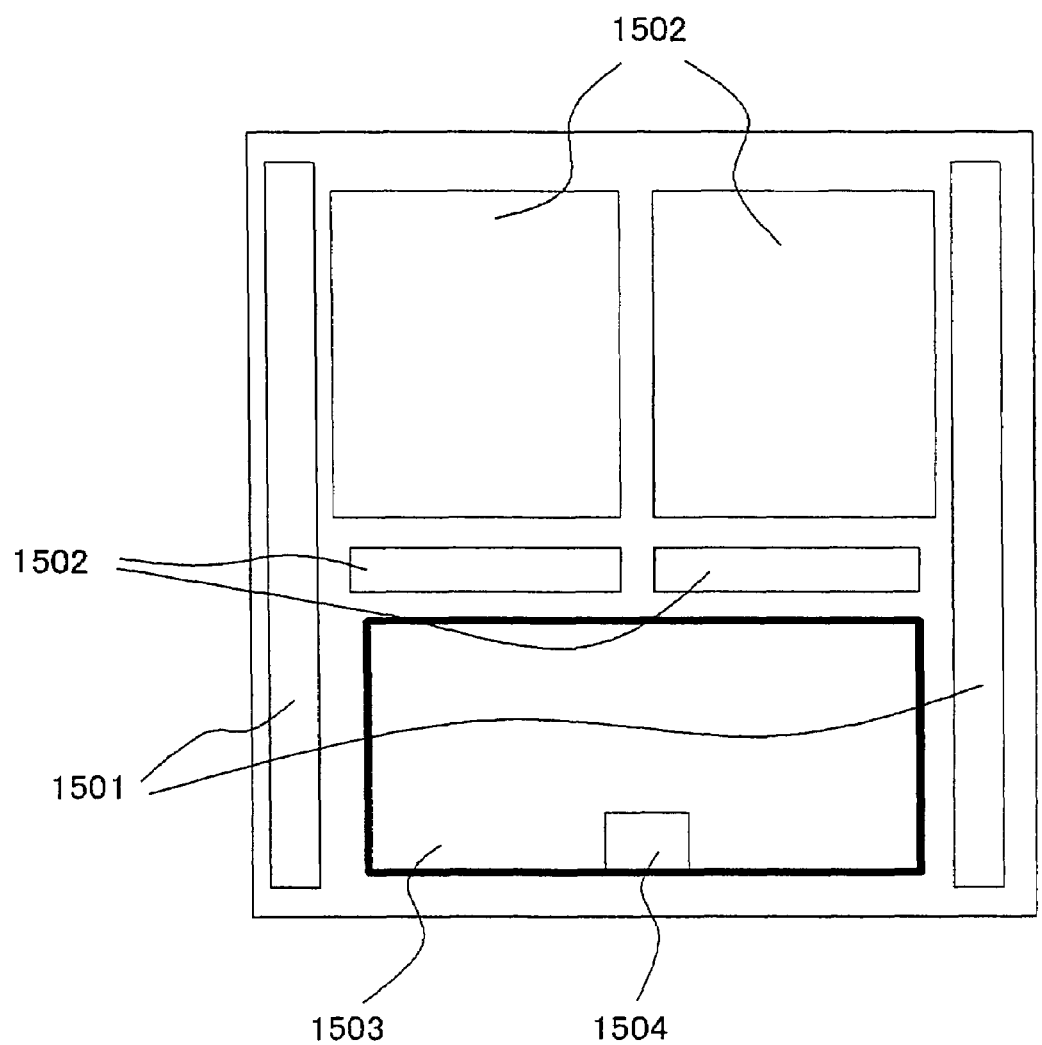
FIG. 15 is a plan view, showing an outline of a general logic product.
Figure 16:
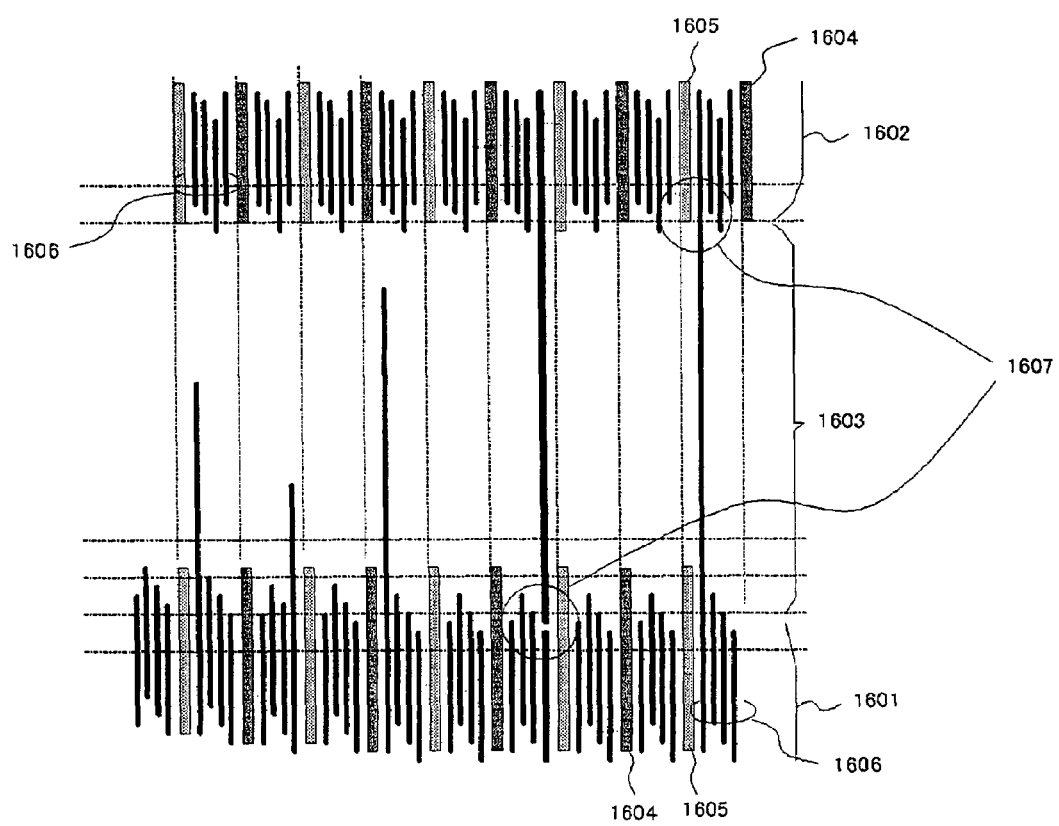
FIG. 16 is a plan view, which is helpful in describing a block coupling structure of two macro circuits in a logic unit in a general interconnect-arrangement structure.
Figure 17:
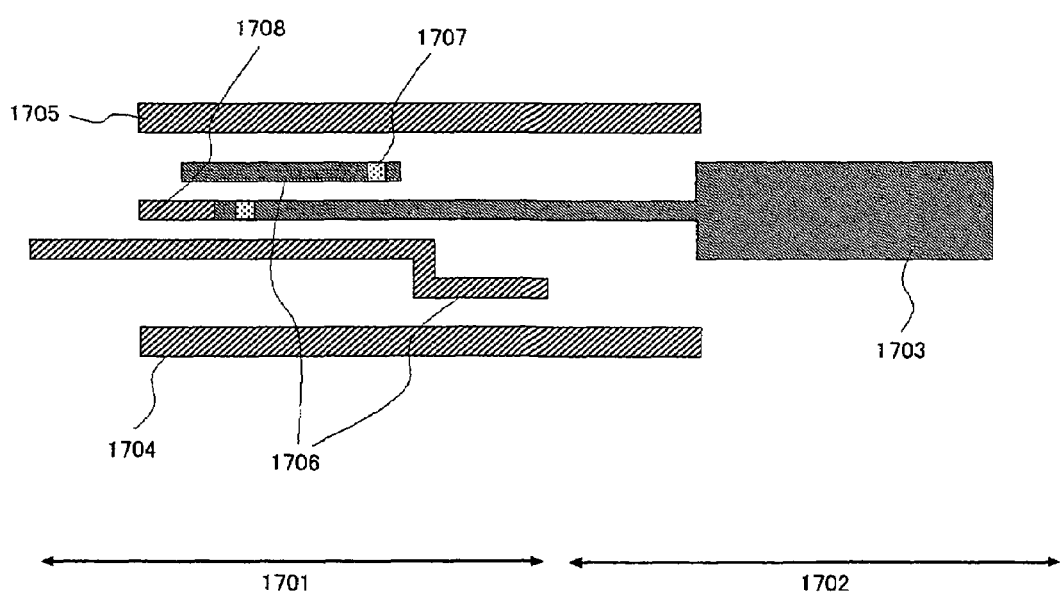
FIG. 17 is a plan view, showing a macro logic unit and a coupling region.

The present invention is applicable to, for example, a general logic circuit as shown in FIG. 15. Here, a block coupling structure of two macro circuits in a logic unit will be described in reference to FIG. 6. FIG. 6 shows a logic unit 601 and a macro coupling region 602. A portion of the interconnect 603 has a linewidth that is wider than a linewidth of the interconnect in the macro in the macro coupling region 602. The interconnect 603 is coupled to a M2 interconnect 608 through via 607 within the macro. The power supply interconnects 604 and the ground interconnects 605 are alternately disposed. It is common that the signal interconnects 606 are disposed between the power supply interconnects 604 and ground interconnects 605. Further, the signal interconnect in y direction is formed of the via 607.

As described above, the present invention may also be applied to general logic products, in addition to the TEG for evaluating the process.

It is apparent that the present invention is not limited to the above embodiment, and may be modified and changed without departing from the scope and spirit of the invention.

What is claimed is:

1. A semiconductor device having an interconnect layer provided on a substrate, comprising:
   a first interconnect, provided in said interconnect layer, and elongating along a first direction included in a substrate surface of said substrate;
   a second interconnect, provided in said interconnect layer, elongating along said first interconnect, and being spaced apart from said first interconnect in plan view; and
   a slit-shaped via plug, provided in said interconnect layer, elongating along a second direction, which is a direction being normal to said first direction and is included in said substrate surface of the substrate, and being capable of electrically coupling said first interconnect to said second interconnect,
   wherein linewidths of said first and said second interconnects are equivalent to a minimum linewidth in the semiconductor device, and said minimum linewidth of said first interconnect is equal to or smaller than 0.1 μm.

2. The semiconductor device according to claim 1, wherein said first and said second interconnects are provided in the same layer in said interconnect layer.

3. The semiconductor device according to claim 1, wherein said second direction is a direction being normal to an elongating direction of a power supply mesh or a ground mesh in the semiconductor device.

4. The semiconductor device according to claim 1, wherein the semiconductor device is provided with a TEG region adapted to evaluate a via chain and interconnects for electrically coupling the TEG region to electrode pads.

5. The semiconductor device according to claim 4, wherein the TEG region includes M1 interconnects and M2 interconnects alternately disposed, and the M1 interconnects and the M2 interconnects are coupled through vias.

6. The semiconductor device according to claim 4, wherein a minimum interval in the TEG region is 140 nm.

7. The semiconductor device according to claim 1, wherein a linewidth of an isolated interconnect region is 0.3 μm.

8. The semiconductor device according to claim 1, wherein the slit-shaped via plug has a width of 70 nm and a length of 210 nm.

9. The semiconductor device according to claim 1, wherein a spacing between the slit-shaped via plug and a most proximal via is equal to or larger than 140 nm.

10. A semiconductor device having an interconnect layer provided on a substrate, comprising:
   a first interconnect, provided in said interconnect layer, and elongating along a first direction included in a substrate surface of said substrate;
   a second interconnect, provided in said interconnect layer, elongating along said first interconnect, and being spaced apart from said first interconnect in plan view; and
   a slit-shaped via plug, provided in said interconnect layer, elongating along a second direction, which is a direction being normal to said first direction and is included in said substrate surface of the substrate, and being capable of electrically coupling said first interconnect to said second interconnect,
   wherein linewidths of said first and said second interconnects are equivalent to a minimum linewidth in the semiconductor device, said minimum linewidth of said first interconnect is equal to or smaller than 0.1 μm, and a spacing between the slit-shaped via plug and a most proximal via is equal to or larger than 140 nm.

11. The semiconductor device according to claim 10, wherein said first and said second interconnects are provided in the same layer in said interconnect layer.

12. The semiconductor device according to claim 10, wherein said second direction is a direction being normal to an elongating direction of a power supply mesh or a ground mesh in the semiconductor device.

13. The semiconductor device according to claim 10, wherein the semiconductor device is provided with a TEG region adapted to evaluate a via chain and interconnects for electrically coupling the TEG region to electrode pads.

14. The semiconductor device according to claim 13, wherein the TEG region includes M1 interconnects and M2 interconnects alternately disposed, and the M1 interconnects and the M2 interconnects are coupled through vias.

15. The semiconductor device according to claim 13, wherein a minimum interval in the TEG region is 140 nm.

16. The semiconductor device according to claim 10, wherein a linewidth of an isolated interconnect region is 0.3 μm.

17. The semiconductor device according to claim 10, wherein the slit-shaped via plug has a width of 70 nm and a length of 210 nm.

18. A semiconductor device provided on a substrate, comprising:
   a first insulating layer;
   a second insulating layer formed in contact with the first insulating layer;
   a first interconnect provided in the second insulating layer, the first interconnect elongating along a first direction parallel to a surface of the substrate;
   a second interconnect provided in the second insulating layer, the second interconnect elongating along the first direction and being spaced apart from the first interconnect in plan view; and
   a slit-shaped via plug provided in the first insulating layer, the slit-shaped via plug elongating along a second direction being perpendicular to the first direction and parallel to the surface of the substrate, and directly contacting both the first interconnect and the second interconnect so as to electrically couple the first interconnect to the second interconnect.

19. The semiconductor device according to claim 18, wherein the first insulating layer comprises a first interlayer insulating film, and the second insulating layer comprises a second interlayer insulating film,
   wherein at least one of the first insulating layer and the second insulating layer further comprises a diffusion barrier film, the diffusion barrier film being formed between the first interlayer insulating film and the second interlayer insulating film.

20. The semiconductor device according to claim 19, wherein the diffusion barrier film is composed of SiC.

* * * * *